(12) United States Patent
Takiguchi

(10) Patent No.: US 6,611,043 B2
(45) Date of Patent: Aug. 26, 2003

(54) BIPOLAR TRANSISTOR AND SEMICONDUCTOR DEVICE HAVING THE SAME

(75) Inventor: Tomio Takiguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/805,135

(22) Filed: Mar. 14, 2001

(65) Prior Publication Data
US 2001/0038139 A1 Nov. 8, 2001

(30) Foreign Application Priority Data
Mar. 15, 2000 (JP) .......................... 2000-072774

(51) Int. Cl.[7] .................. H01L 27/082; H01L 27/102; H01L 31/11; H01L 27/10; H01L 29/76; H01L 29/94

(52) U.S. Cl. .................. 257/565; 257/566; 257/205; 257/401

(58) Field of Search .................. 257/565–594, 257/205, 401; 438/313, 340, 343, 330, 329, 350, 328, 236, 213, 322, 323, 904

(56) References Cited

U.S. PATENT DOCUMENTS 4,047,217 A * 9/1977 McCaffrey et al. ......... 257/553
4,047,220 A * 9/1977 Ferro et al. .................. 257/500
5,828,124 A * 10/1998 Villa .......................... 257/557
6,005,271 A * 12/1999 Hshieh ....................... 257/331
6,084,263 A * 7/2000 Tsuchitani et al. .......... 257/328
6,121,102 A * 9/2000 Norstrom et al. ........... 438/361
6,310,368 B1 * 10/2001 Yagura ....................... 257/197

FOREIGN PATENT DOCUMENTS

| JP | 61-74368 | 4/1986 |
|---|---|---|
| JP | 61-159762 | 7/1986 |
| JP | 62-143465 | 6/1987 |
| JP | 64-31452 | 2/1989 |
| JP | 2-222541 | 9/1990 |
| JP | 6-151705 | 5/1994 |
| JP | 6-161705 | 5/1994 |
| JP | 11-121459 | 4/1999 |

* cited by examiner

Primary Examiner—Tom Thomas
Assistant Examiner—Samuel A. Gebremariam
(74) Attorney, Agent, or Firm—Sughrue Mion, PLLC

(57) ABSTRACT

A bipolar transistor is provided with a collector layer of a first conductive type, a base layer of a second conductive type formed at a surface of the collector layer, and an emitter layer of the first conductive type formed at a surface of the base layer. An emitter electrode is connected to the emitter layer. Base electrodes are connected to the base layer and surround the emitter electrode. Emitter electrodes are connected to the collector layer and surround the base electrodes.

6 Claims, 9 Drawing Sheets

BIPOLAR TRANSISTOR AND SEMICONDUCTOR DEVICE HAVING THE SAME

BACKGROUND OF THE INVENTION

1. Field of the Invention

The present invention relates to a bipolar transistor suitable for a reference voltage source circuit used as a power source circuit for integrated circuits and the like, and a semiconductor device having the same, and more specifically to a bipolar transistor designed to stabilize reference voltage output when applied in a reference voltage source circuit, and a semiconductor device having the same.

2. Description of the Related Art

It is necessary to raise the relative precision of the element and the absolute precision of the resistance, when providing a semiconductor device with a reference voltage source circuit. Therefore, conventionally, it has been common to manufacture the reference voltage source circuit by means of a bipolar process used very often and chiefly in analog circuits. This is because since an analog circuit was held to be necessary for the reference voltage source circuit, there was no choice but to use a bipolar process.

Recently, however, as circuits have become integrated, analog circuits have also started to be built into CMOS processes used in digital circuits. This has made it necessary to incorporate reference voltage source circuits into the CMOS process.

FIG. 1 is a circuit diagram showing a conventional reference voltage source circuit. The conventional reference voltage source circuit is provides with two PNP transistor groups GQ31 and GQ32, whose collectors and bases are grounded. A resistor RE33 and a resistor RE32 are connected to the emitter of the PNP transistor group GQ32 in series, in that order. Additionally, a resistor RE31 is connected to the emitter of the PNP transistor group GQ31. Further, the input terminals of an amplifier AMP31 are connected to the connection point of the emitter of the PNP transistor group GQ31 and the resistor RE31, and to the connection point of the resistor RE32 and the resistor RE33. The other end of the resistor RE32 and the other end of the resistor RE31 have a common connection, and this connection point is connected to the output terminal of the amplifier AMP31. Further, an output voltage terminal OUT31 is connected to the output terminal of the amplifier AMP31. Note that the amplifier AMP31 is composed of a CMOS transistor and the like.

Both of the PNP transistor groups GQ31 and CQ32 are composed of a plurality of PNP transistors. FIG. 2 is a layout diagram showing a layout of PNP transistors making up the PNP transistor groups GQ31 and GQ32. Below, the reference voltage source circuit described here in FIG. 2 shall be called as a first prior art.

As shown in FIG. 2, the PNP transistor group GQ31 comprises three PNP transistors Q111 through Q113 arrayed in a vertical column, and the PNP transistor group GQ32 comprises nine PNP transistors Q121 through Q129 arrayed in three rows and three columns. In each of the PNP transistors Q111 through Q113 and Q121 through Q129, an emitter electrode 106 is connected to the central portion of an emitter 103. A base 102 is formed around the periphery of the emitter 103, and within base 102, base electrodes 107 are connected on either side of the emitter 103, in the row direction as seen from the emitter 103. A collector 101 is common to each of the PNP transistors, and collector electrodes 108 are connected on either side of the base 102 of each PNP transistor, in the row direction as seen from the base 102. Note that each of the PNP transistors has the same emitter surface area. As the PNP transistor group GQ32 includes the nine PNP transistors Q121 through Q129 while the PNP transistor group GQ31 includes the three PNP transistors Q111 through Q113, the total emitter area of the PNP transistor group GQ32 is three times that of the PNP transistor group GQ31.

The reference voltage Vout output of a conventional reference voltage source circuit constructed in this way is shown in Formula 1 shown below, where the resistance of the resistor RE31 and RE32 is y, the resistance of the resistor RE33 is x, the voltage between the emitter and base of the PNP transistor group GQ31 is VEBGQ31, the total emitter surface area of the PNP transistor group GQ31 is M, the total emitter surface area of the PNP transistor group GQ32 is N, the Boltzmann's constant is k, the absolute operating temperature is T, the elementary electric charge is q.

$$Vout = VEBG31 + \frac{y}{x} \cdot \frac{k \cdot T}{q} \cdot \log_e\left(\frac{N}{M}\right) \qquad \text{[Formula 1]}$$

Thus, reference voltage Vout fluctuates depending on the resistance ratio of the resistors (y/x), and the total emitter area ratio of the transistors (N/M). Consequently, even if the absolute values of the resistance x and y, and total emitter surface area N and M, change, as long as their respective ratios do not change, the reference voltage Vout will be stable. Under these circumstances, since, in the first prior art, the PNP transistor groups Q31 and Q32 are composed of a plurality of transistors, even if a number of these had low levels of precision, the impact on the overall relative precision would be slight. For this reason, as described above the reference voltage Vout is stable. Consequently, constructing a transistor group from a plurality of transistors facilitates the manufacture of a reference voltage source circuit with stable reference voltage.

Additionally, as the number of each electrode is kept down, the amount of space they take up on the chip is small. An array of the PNP transistors as shown in FIG. 2 is described, for example, in the literature "A Precision Curvature-Compensated CMOS Bandgap Reference" (cited from: P634–643 IEEE JURNAL OF SOLID-STATE CIRCUITS, VOL. SC-18, No. 6, December 1983). The reference voltage source circuit described in this literature provides a separate external resistor in order to compensate from the gap from DC operation.

In another prior art from the literature, a reference voltage source circuit with a construction in which a plurality of transistors arrayed in a column have a collector in common is described in "A Precision CMOS Bandgap Reference" (cited from: IEEE JOURNAL OF SOLID-STATE CIRCUITS, VOL, SC-19, No. 6, December 1984 P1014–1021). The conventional reference voltage source circuit described below shall be called a second prior art. FIG.3 shows a layout diagram of the reference voltage source circuit according to the second prior art.

Two transistor groups GQ41 and GQ42 are provided in the second prior art. The transistor group GQ41 is made up of five transistors Q131 through Q135 forming a column, and the transistor group GQ42 is made up of twenty-five transistors Q141 through Q165 forming five rows and five columns. Consequently, the total emitter surface area ratio of the transistor group GQ41 to the transistor group GQ42 is 1:5.

Note that while the above-mentioned reference in the literature does not describe the electrode arrangement and the like of each transistor in detail, it is thought that the five transistors forming a column have a collector 111 in common, and that a base electrode 117 and an emitter electrode 116 in a group of one row are alternately arrayed.

Additionally, Japanese Patent Laid-Open Publication No. Hei. 6-151705 discloses a bandgap generator circuit provided with a transistor group made up of a plurality of transistors in a square formation when seen from the plane. Below, this conventional bandgap generator circuit shall be called as a third prior art.

In the third prior art, the four transistors in a square formation are laid out in a square lattice formation. The four transistors have a collector and a base in common.

In the first prior art, however, since there is a large amount of parasitic resistance on the base and collector in each transistor, there is a problem in that the size of resistors RE31 and RE32 must be increased, and the current flowing through the transistor group GQ31 and GQ32 must be decreased, in order for the transistor group GQ31 and GQ32 to operate in a state approaching an ideal state. That is, increasing the size of the resistors RE31 and RE32 increases the amount of resistance noise generated in proportion to the resistance of these resistors. Additionally, the sealing process of semiconductor chips and the like applies a great deal of stress in the lateral direction of FIG. 2, which warps the surface of the semiconductor chip. This warping acts on the cross-sectional direction of the semiconductor device, and tends to worsen the relative precision of the PNP transistor, as this warping impacts the transistor groups GQ31 and GQ32 in which the PNP transistors are formed in the same depth-wise direction. In particular, if the transistor groups GQ31 and GQ32 are arrayed so that they are elongated along the same direction of this directional warping stress distribution, there is the limitation that output voltage and temperature characteristics become susceptible to fluctuation. Consequently, when designing a semiconductor chip provided therewith, the anisotropy of these characteristics must be taken into account, decreasing the design margin.

Furthermore, in the above-mentioned literature employing this construction, a separate resistor is provided in order to compensate for the gap in PNP transistor characteristics caused by parasitic resistance on the base portion. However, this construction of a compensatory resistor makes the chip area even larger.

Additionally, the second prior art has a problem in that there is a large amount of resistance noise in the resistors consequent to the parasitic resistance on the base and collector is large. Additionally, because the five transistors forming a column are provided with one collector electrode, the parasitic resistance on the collector is different as seen from each transistor, it is difficult to secure a relative precision between each resistance. This results in the following problem: many of the transistors are not in an ideal state, making it impossible to obtain a desired reference voltage output. Furthermore, as with the first prior art, the direction in which warping is generated creates the problem of large fluctuations in the output voltage and temperature characteristics, making it necessary to take this into consideration when designing semiconductor chips. Consequently, as mentioned above, this has the limitation of decreasing the design margin.

Furthermore, in the third prior art, as the four transistors have a collector and a base in common, the parasitic resistance on the base is different between each transistor. For this reason, as with the second prior art, this results in the problem that many of the transistors are not in an ideal state, making it impossible to obtain a desired reference voltage output. Additionally, the reduction of parasitic resistance on the collector and base is not sufficient.

SUMMARY OF THE INVENTION

An object of the present invention is to provide a bipolar transistor capable of reducing design limitations and reducing the resistance noise generated by resistors in the case of application to a reference voltage source circuit, and a semiconductor device having the same.

According to one aspect of the present invention, a bipolar transistor comprises a collector layer of a first conductive type, a base layer of a second conductive type formed at a surface of the collector layer, and an emitter layer of the first conductive type formed at a surface of the base layer. An emitter electrode is connected to the emitter layer. Base electrodes are connected to the base layer and surround the emitter electrode. Collector electrodes are connected to the collector layer and surround the base electrodes.

In the present invention, the parasitic resistance on the base and collector is isotropic in comparison with conventional ones, as the emitter electrode is surrounded by the base electrodes, and the base electrodes are surrounded by the collector electrodes. For this reason, the variation in their respective parasitic resistance is lessened. Additionally, the total parasitic resistance is reduced. Consequently, a wide design margin can be secured, while at the same time allowing the resistance of the resistors connected to the bipolar transistor to be lessened in the case of application to a reference voltage source circuit, resulting in reduced resistance noise.

It is preferable that the base layer and emitter layer have a square shape seen from above, and that the emitter layer is provided in the center of the base layer. Selecting this type of shape and layout increases the isotropy of the bipolar transistor.

According to another aspect of the present invention, a semiconductor device comprises a plurality of the bipolar transistors.

Additionally, it is preferable for the collector layer of each of the bipolar transistors to be made up of a single semiconductor layer. This construction makes it possible to secure a high emitter surface relative precision, facilitating the acquisition of a stable reference voltage output when applied to a reference voltage source circuit.

Furthermore, it is preferable for the bipolar transistors to be arrayed in a matrix formation. It is more desirable for the bipolar transistors to be arrayed in a square formation with the same number arrayed in the vertical direction as the horizontal direction. This square-formation layout makes it possible to obtain high isotropy on a chip.

Furthermore, the bipolar transistors may be defined into two or more groups, and within each group, the collector electrodes may be connected to one another, the base electrodes may be connected to one another, and the emitter electrodes may be connected to one another. In this case, when the bipolar transistors arrayed in a square formation is partitioned by a diagonal line of the square, it is preferable that bipolar transistors in each of said groups are arrayed in linear symmetry about said diagonal line. It is possible to ensure isotropy in at least the two 45-degree angle directions from that diagonal line.

DETAILED DESCRIPTION OF THE PREFERRED EMBODIMENT

Preferred embodiments of the present invention will be described in detail with reference to the accompanying drawings.

Figure 1:
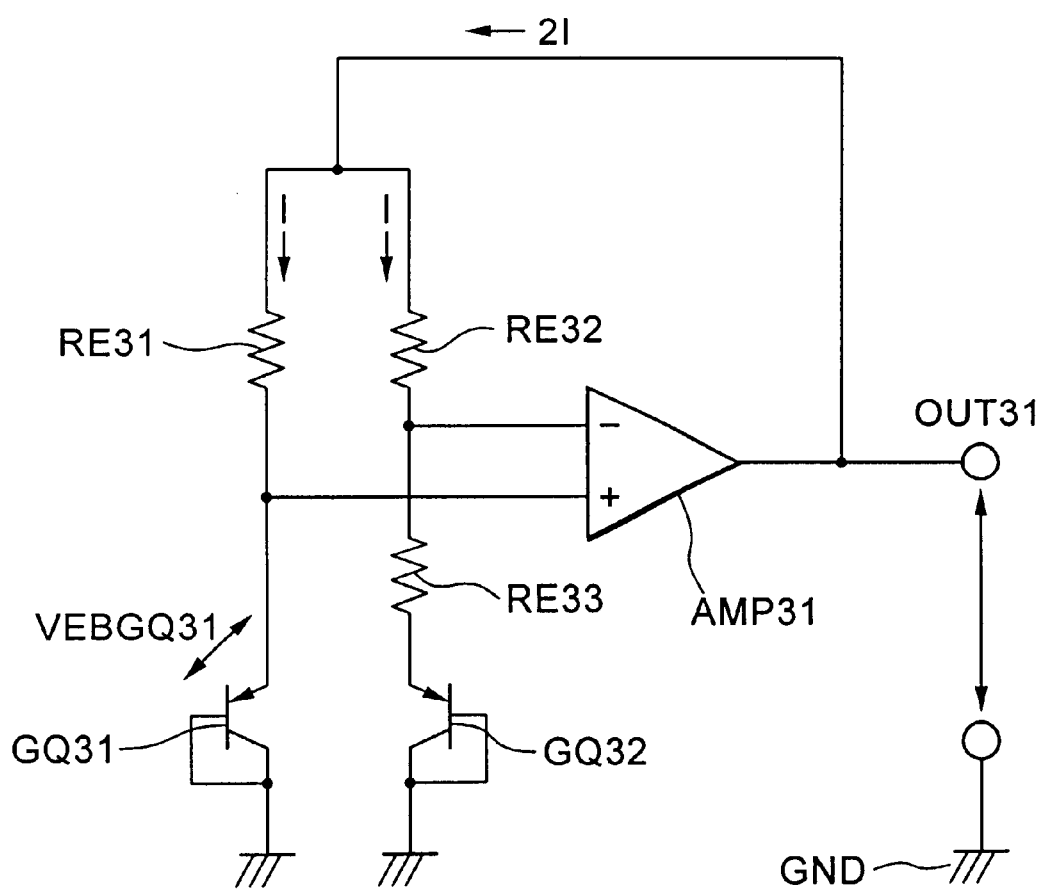
FIG. 1 is a circuit diagram showing a reference voltage source circuit of the prior art.
Figure 2:
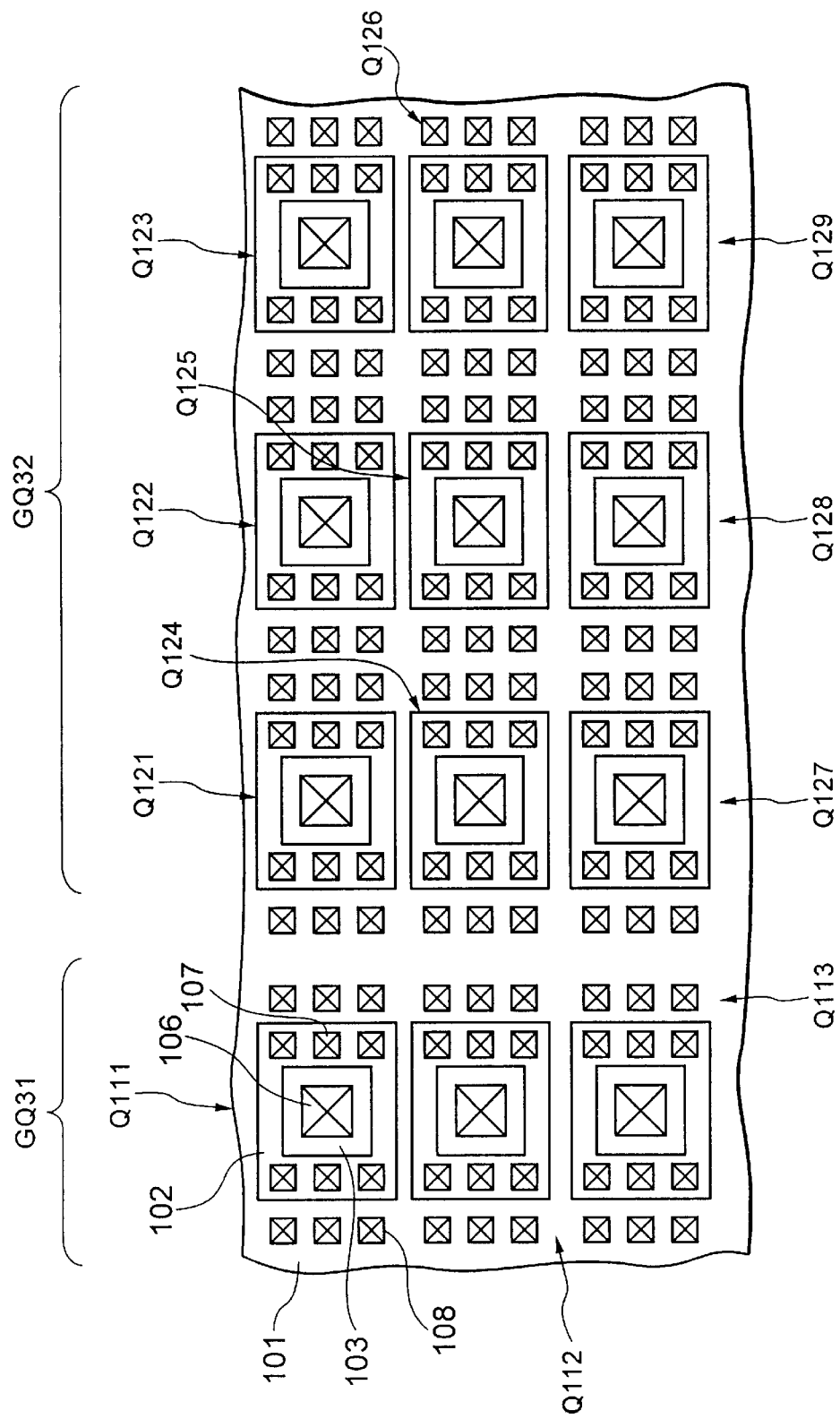
FIG. 2 is a layout diagram showing a layout of the PNP transistors making up the PNP transistor groups GQ31 and GQ32.
Figure 3:
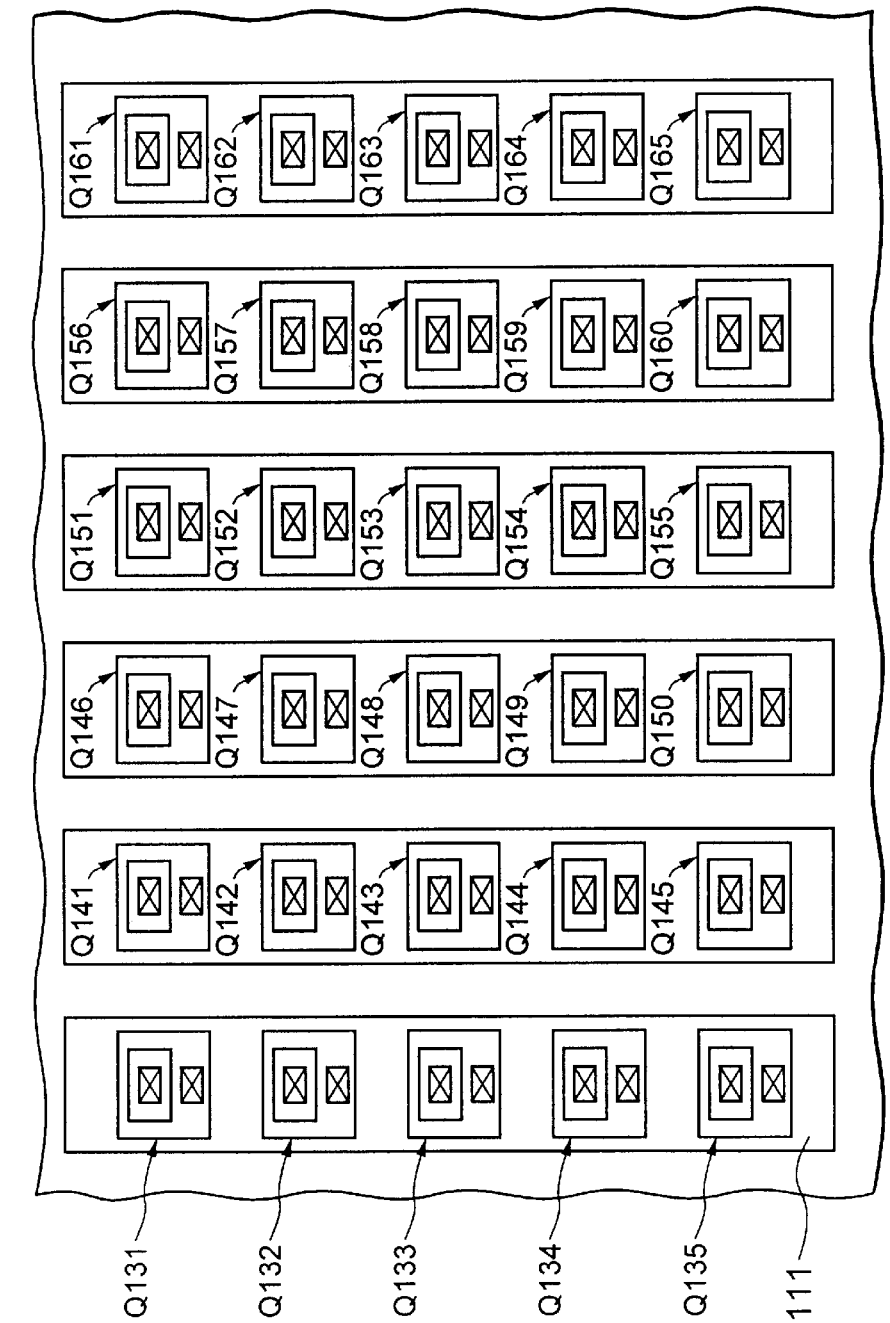
FIG. 3 is a layout diagram showing a reference voltage source circuit according to a second prior art.
Figure 4:
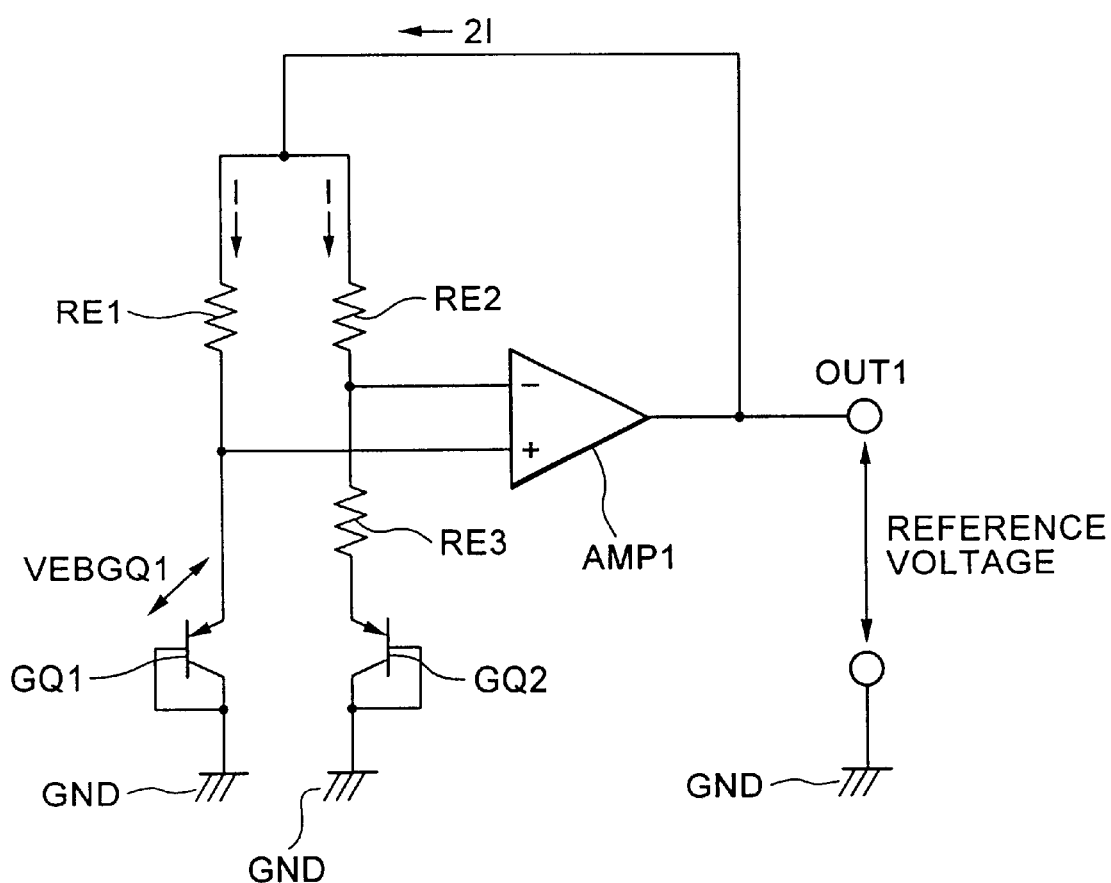
FIG. 4 is a circuit diagram showing a reference voltage source circuit according to a first embodiment of the present invention.
Figure 5:
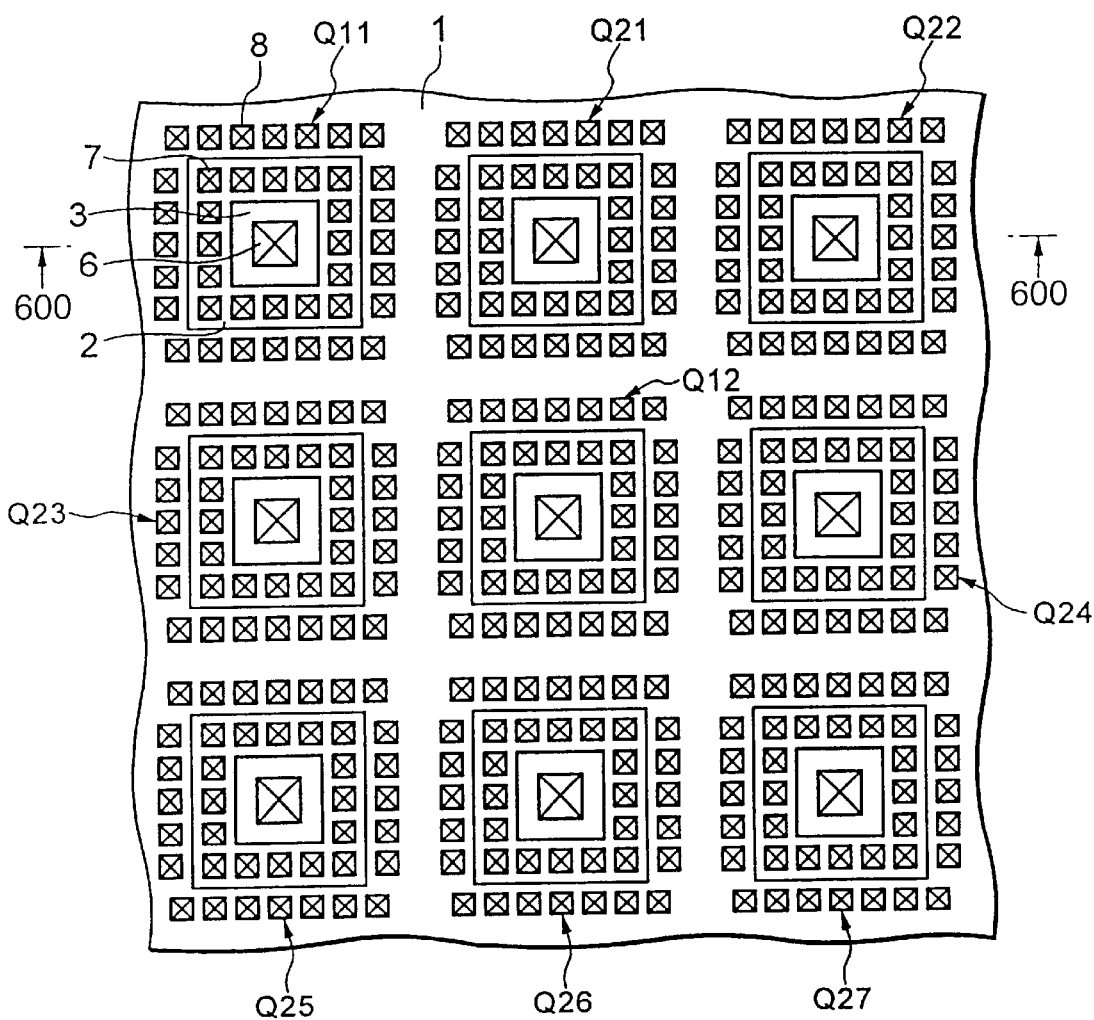
FIG. 5 is a layout diagram showing a layout of the PNP transistors making up the PNP transistor groups GQ1 and GQ2 in the first embodiment.
Figure 6:
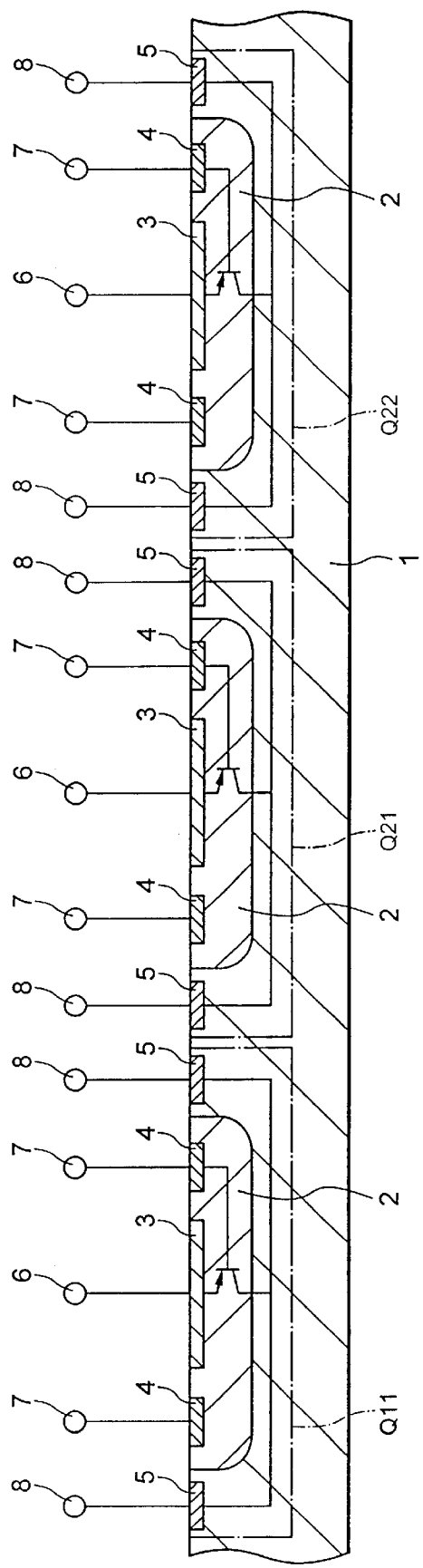
FIG. 6 is a cross-sectional view taken along the line 600—600 in FIG. 5.
Figure 7:
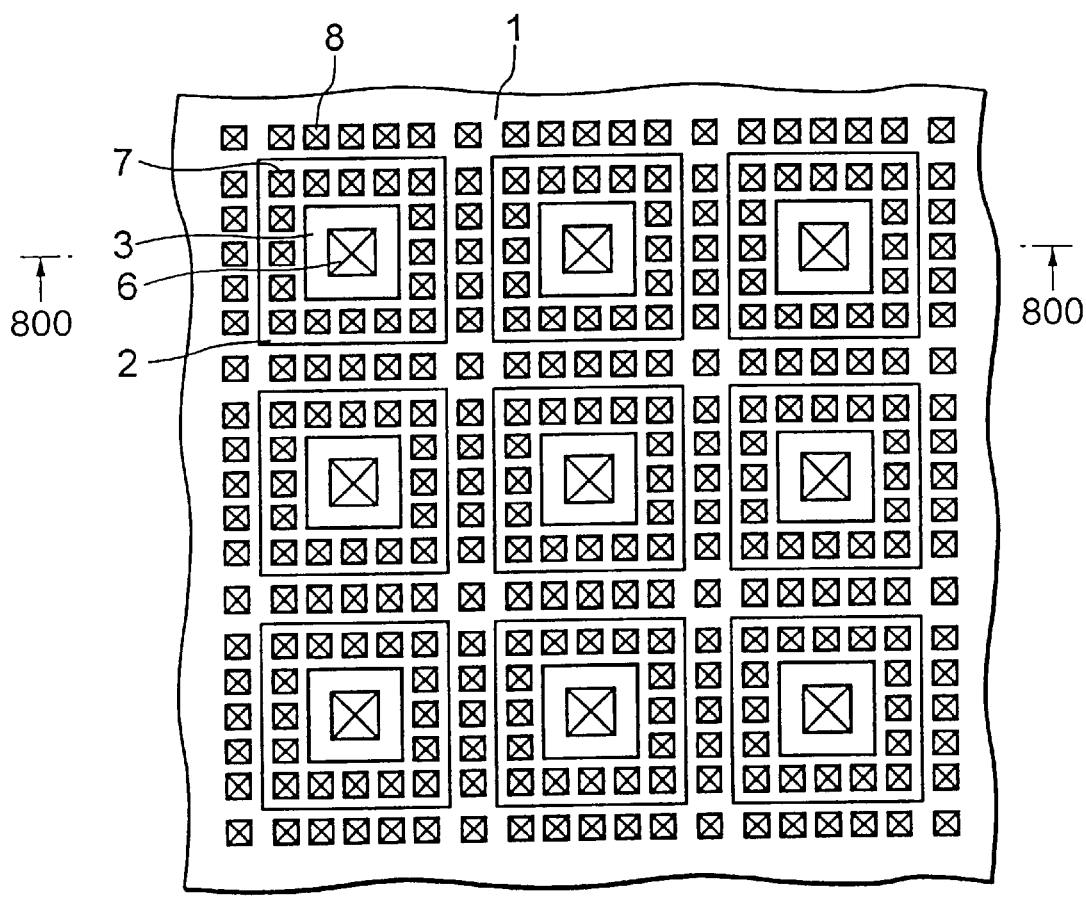
FIG. 7 is a layout diagram showing a layout of the PNP transistors making up the PNP transistor groups GQ1 and GQ2 in a second embodiment of the present invention.

Although the reference voltage source circuit according to a first embodiment of the present invention has the same circuit construction as the conventional one shown in FIG. 7, the layout of the PNP transistors making up the PNP transistor group is different from the conventional type. FIG. 4 is a circuit diagram showing a reference voltage source circuit relating to the first embodiment of the present invention. FIG. 5 is a layout diagram showing the layout of the PNP transistors making up the PNP transistor groups GQ1 and GQ2 of the first embodiment, and FIG. 6 is a cross-sectional view taken along the line 600—600 in FIG. 5.

As shown in FIG. 4, the reference voltage source circuit of the present embodiment is provided with PNP transistor groups GQ1 and GQ2 having a grounded collector and a grounded base. A resistor RE3 and a resistor RE2 are connected to the emitter of grounded PNP transistor group GQ2 in series, in that order. Additionally, a resistor RE1 is connected to the emitter of grounded PNP transistor group GQ1. Further, the input terminals of an amplifier AMP1 are connected to the connection point of the emitter of the PNP transistor group GQ1 and the resistor RE1, and to the connection point of the resistor RE2 and the resistor RE3. The other ends of the resistor RE2 and RE1 are connected to each other, and this connection point is connected to the output terminal of the amplifier AMP1. Further, the output terminal of the amplifier AMP1 is connected to a voltage output terminal OUT1. The amplifier AMP1 is composed of a CMOS transistor and the like.

The resistance of the resistor RE1 being R1, the resistance of the resistor RE2 being R2, and the resistance of the resistor RE3 being R3, the resistance R1 and the resistance R2 are equal to each other and temperature fluctuations are not generated in them. The emitter junction area of the PNP transistor group GQ1 is M, and the emitter junction area of the PNP transistor group GQ2 is N. Additionally, the gain of the amplifier AMP1 is unlimited, and both input leak current and output resistance thereof are zero, so that there is no differential input offset. Furthermore, the base current of the PNP transistor groups GQ1 and GQ2 is so small in comparison to the collector current that it can be ignored.

Additionally, the PNP transistor groups GQ1 and GQ2 are composed of, for example, a total of nine PNP transistors Q11, Q12, and Q21 through Q27. These PNP transistors are arrayed in square layouts of three in the vertical direction and three in the horizontal direction. Specifically, in FIG. 5 are arrayed PNP transistor Q11 on the first row, the first column; PNP transistor Q21 on the first row, the second column; PNP transistor Q22 on the first row, the third column; PNP transistor Q23 on the second row, the first column; PNP transistor Q12 on the second row, the second column; PNP transistor Q24 on the second row, the third column; PNP transistor Q25 on the third row, the first column; PNP transistor Q26 on the third row, the second column; and PNP transistor Q27 on the third row, the third column. Further, PNP transistor group GQ1 is composed of PNP transistors Q11 and Q12, and PNP transistor group GQ2 is composed of PNP transistors Q21 through Q27.

Additionally, as shown in FIG. 6, the PNP transistor Q11 is provided with an $N^-$ well 2 selectively formed at the surface of a $P^-$ substrate 1. The plane-wise shape of the $N^-$ well 2 is, for example, a square formation. A $P^+$ diffusion layer 3 is formed in the center at the surface of the $N^-$ well 2, and the $P^+$ diffusion layer 3 is connected to an emitter electrode 6.

Additionally, a plurality of $N^+$ diffusion layers 4 are formed around the periphery of the $P^+$ diffusion layer 3 at the surface of the $N^-$ well 2, so that the $P^+$ diffusion layer 3 is surrounded. As shown in FIG. 5, each of the $N^+$ diffusion layers 4 is connected to a base electrode 7. Furthermore, a plurality of $P^+$ diffusion layers 5 are formed around the periphery of the $N^-$ well 2 formed at the surface of the $P^-$ substrate 1, so that the $N^-$ well 2, as well as the $N^+$ diffusion layers 4, are surrounded. As shown in FIG. 5, each of the $P^+$ diffusion layers 5 is connected to a collector electrode 8.

On the PNP transistor Q11 thus constructed, the $P^+$ diffusion layer 3 acts as an emitter, the $N^-$ well 2 as a base, and the $P^-$ substrate 1 as a collector. Note that as shown in FIG. 6, the PNP transistors Q11, Q21, and Q22 have the same construction, and although not shown in the drawing, the other PNP transistors Q12 and Q23 through Q27 also have the same construction.

Further, in the PNP transistor group GQ1, the emitter electrodes 6 of the PNP transistors Q11 and Q12 are connected to each other, the base electrodes 7 thereof are connected to each other, and the collector electrodes 8 thereof are connected to each other. Similarly, in the transistor group GQ2, the emitter electrodes 6 of the PNP transistors Q21 through Q27 are connected to one another, the base electrodes 7 thereof are connected to one another, and the collector electrodes 8 are connected to one another.

Since in the first embodiment constructed in this way, the emitters of each of PNP transistors Q11, Q12, and Q21 through Q27 are surrounded by the base electrodes 7 and the collector electrodes 8, the current flowing between the emitters and the bases, and the current flowing between the bases and the collectors, flows in either direction around the periphery, making it possible to greatly reduce the parasitic resistance on the base and the parasitic resistance on the collector over conventional constructions. As a result, even if the PNP transistor groups GQ1 and GQ2 are operating at a state approaching an ideal state, it is possible for a greater amount of current to flow than with conventional constructions. Consequently, it is possible to reduce the resistance of resistors RE1, RE2 and RE3 connected to the PNP transistor groups GQ1 and GQ2, which makes it possible to reduce the amount of surface area and reduce the amount of resistance noise generated thereby.

Additionally, in the first embodiment, as at least four directions—namely, the up, down, right and left directions—are isotropic, even changing the layout in the vertical or horizontal directions will do little to change the directional relative precision. Consequently, even if stress in one direction, for example in the horizontal direction, generates warping, its impact is slight, and the fluctuation in reference output voltage and temperature characteristics are extremely slight. For this reason, since it is not necessary to devise special limitations on the layout of these PNP transistors in order to improve the relative precision of the emitter surface area on a semiconductor chip, the design margin is broadened.

Furthermore, a check as to which the PNP transistor group each of the nine PNP transistors is allocated to will show that the array of nine PNP transistors shows line symmetry, along the axis of symmetry created by the diagonal line joining the PNP transistor Q11 with the PNP transistor Q27. On this point as well, the change in directional relative precision is slight, broadening the design margin of semiconductor chips.

The output reference voltage Vout is shown in Formula 2 shown below, in which resistance of the resistors RE1 and RE2 is y, the resistance of the resistor RE3 is x, the voltage between the emitter and base of the PNP transistor group GQ1 is VEBGQ1, the total emitter surface area of the PNP transistor group GQ1 is M, and the total emitter surface area of the PNP transistor group GQ2 is N.

$$Vout = VEBGQ1 + \frac{y}{x} \cdot \frac{k \cdot T}{q} \cdot \log_e\left(\frac{N}{M}\right)$$ [Formula 2]

Next, a description will be made on a method for manufacturing a reference voltage source circuit according to the first embodiment described above. This reference voltage source circuit can be conducted in parallel with a process for manufacturing a CMOS transistor.

First, the N⁻ well 2 is formed at the surface of the P⁻ substrate 1, at the same time an N-well formed of a P-channel MOS transistor included in a CMOS transistor. Subsequently, source/drain diffusion layers of the P-channel MOS transistor are formed, while at the same time forming the P⁺ diffusion layers 3 and 5 with high impurity concentrations. Source/drain diffusion layers are formed of an N-channel MOS transistor included in the CMOS transistor, while at the same time forming the N⁺ diffusion layers 4 with high impurity concentration. Note that it is permissible to form either the P⁺ diffusion layers 3 and 5 or the N⁺ diffusion layers 4 first.

This method makes it possible to easily manufacture a PNP transistor in the depth-wise direction of a substrate, without adding new processes to the CMOS process.

Figure 8:
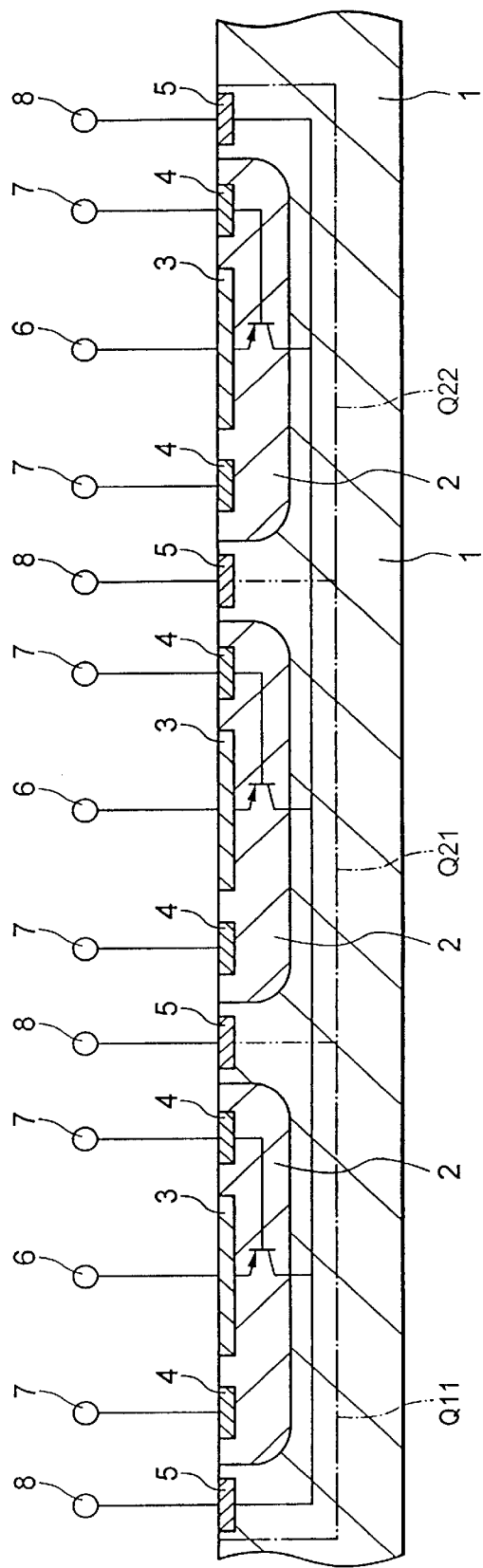
FIG. 8 is a cross-sectional view taken along the line 800—800 in FIG. 7.

It should be noted that although in the first embodiment, the collector electrode 8 is provided on each of the PNP transistors, it is also permissible for adjacent PNP transistors to have a collector electrode in common. A second embodiment described below employs this type of construction. FIG. 7 is a layout diagram showing a layout of the PNP transistors making up the PNP transistor groups GQ1 and GQ2 in the second embodiment, and FIG. 8 is a cross-sectional view taken along the line 800—800 in FIG. 7.

The circuit construction of the second embodiment is the same as that of the first embodiment shown in FIG. 4, but the layout of the PNP transistors in the PNP transistor groups GQ1 and GQ2 differs from that of the first embodiment. That is, as shown in FIGS. 7 and 8, between the bases of the adjacent PNP transistors Q11 and Q12 is provided a single column of the collector electrodes 8, and this single column of collector electrodes 8 is common to the PNP transistors Q11 and Q12.

This type of construction makes it possible to reduce the chip surface area. Additionally, with this type of construction, the collectors of both PNP transistor groups GQ1 and GQ2 are grounded, as shown in FIG. 4, so no inconveniences result.

Figure 9:
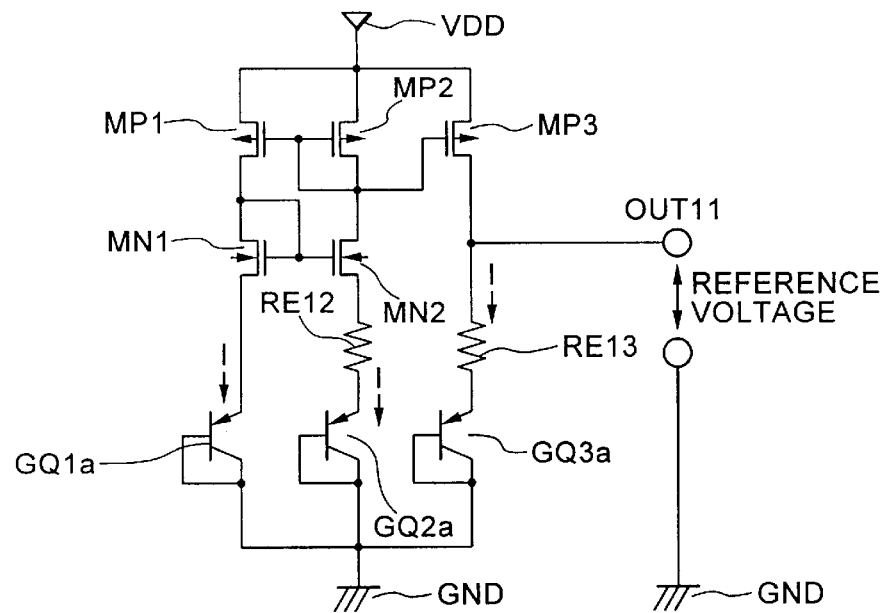
FIG. 9 is a circuit diagram showing a reference voltage source circuit provided with three PNP transistor groups with common collector and base which are grounded.
Figure 10:
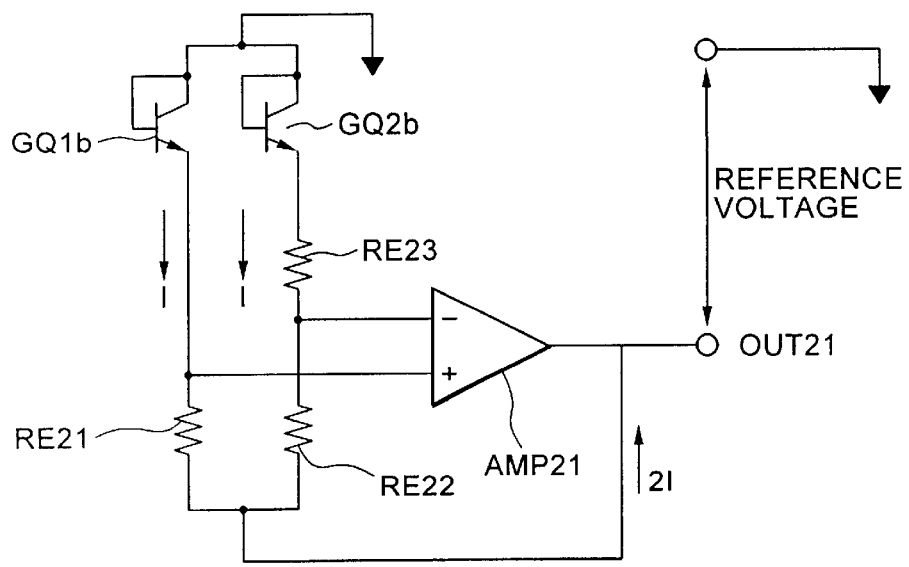
FIG. 10 is a circuit diagram showing a reference voltage source circuit using an n-type semiconductor substrate.

Note that the reference voltage source circuit construction is not limited to that shown in FIG. 4. For example, it is also permissible to provide three PNP transistor groups with collectors and bases grounded, and it is also permissible to use an N-type semiconductor substrate in place of a P-type semiconductor substrate. FIG. 9 is a circuit diagram showing a reference voltage source circuit providing the three PNP transistor groups with collectors and bases grounded, and FIG. 10 is a circuit diagram showing a reference voltage source circuit using an N-type semiconductor substrate.

The reference voltage source circuit shown in FIG. 9 is provided with three PNP transistor groups GQ1a, GQ2a, and GQ3a, of which collectors and bases are grounded. A resistor RE12 is connected to the emitter of the PNP transistor group GQ2a, and a resistor 13 is connected to the emitter of the PNP transistor group GQ3a. Additionally, the circuit is provided with an N-channel MOS transistor MN1 whose source is connected to the emitter of the PNP transistor group GQ1a, and whose drain and gate are mutually connected, and is also provided with and an N-channel MOS transistor MN2 connected to the resistor RE12. The gates of the N-channel MOS transistors MN1 and MN2 are connected to each other.

Furthermore, the circuit is provided with P-channel MOS transistors MP1, MP2 and MP3. The source of the P-channel MOS transistor MP1 is connected to the drain of the N-channel MOS transistor MN1, and the gate of the P-channel MOS transistor MP1 is connected to the drain of the N-channel MOS transistor MN2. The source of the P-channel MOS transistor MP2 is connected to the drain of the N-channel MOS transistor MN2, and the gate of the P-channel MOS transistor MP2 is connected to the drain of the N-channel MOS transistor MN2. The source of the P-channel MOS transistor MP3 is connected to the resistor RE13, and the gate of the P-channel MOS transistor MP3 is connected to the drain of the N-channel MOS transistor MN2.

Further, the drains of the P-channel MOS transistors MP1, MP2, and MP3 are set to a power source potential VDD. Additionally, the connection point of the resistor RE13 and the P-channel MOS transistor MP3 is connected to a voltage output terminal OUT11.

It should be noted that the three P-channel MOS transistors MP1, MP2, and MP3 are transistors of the same size. These form a current mirror circuit, making the current I flowing through each of the P-channel MOS transistors MP1, MP2, and MP3 equal to one another. Additionally, the two N-channel MOS transistors MN1 and MN2 are transistors of the same size. Furthermore, the total emitter surface areas of the PNP transistor groups GQ2a and GQ3a are equal to each other.

The output reference voltage Vout is shown in Formula 3 shown below, wherein resistance of the resistor RE12 is x, the resistance of the resistor RE13 is y, the voltage between the emitter and base of the PNP transistor group GQ1a is VEBGQ1a, the total emitter surface area of the PNP transistor group GQ1a is M, and the total emitter surface area of the PNP transistor groups GQ2a and GQ3a is N.

$$Vout = VEBGQ1a + \left(\frac{y}{x} - 1\right) \cdot \frac{k \cdot T}{q} \cdot \log_e\left(\frac{N}{M}\right) \quad \text{[Formula 3]}$$

In the case that the reference voltage source circuit is thus constructed, for example the PNP transistor groups GQ1a, GQ2a, and GQ3a can be composed of twenty-five PNP transistors arrayed in five rows and five columns. In this case, for example, it is permissible to allocate three PNP transistors to the PNP transistor group GQ1a, eleven PNP transistors to the PNP transistor group GQ2a, and the remaining eleven PNP transistors to the PNP transistor group GQ3a.

Meanwhile, in the reference voltage source circuit shown in FIG. 10 are provided with two NPN transistor groups GQ1b and GQ2b, the collector and base thereof being set to a potential VSS. Resistors RE23 and RE22 are connected to the emitter of the NPN transistor group GQ2b in series, in that order. In addition, a resistor RE21 is connected to the emitter of the NPN transistor group GQ1b. Further, the input terminals of an amplifier AMP21 are connected to the connection point of the emitter of the NPN transistor group GQ1b and the resistor RE21, and the connection point of the resistor RE22 and the resistor RE23. The other ends of the resistor RE22 and RE23 are connected to each other, and this connection point is connected to the output terminal of the amplifier AMP21. Further, an output voltage terminal OUT21 is connected to the output terminal of the amplifier AMP21. The amplifier AMP21 is composed of a CMOS transistor and the like. Power source voltage in potential VSS or −VSS is applied to the amplifier AMP21.

Note that, the gain of the amplifier AMP21 is unlimited, and both input leak current and output resistance thereof are zero, so there is no differential input offset. Furthermore, the base current of the NPN transistor groups GQ1b and GQ2b is so small in comparison to the collector current that it can be ignored. Furthermore, the resistance of the resistor RE21 and the resistance of the resistor RE22 are equal to each other, and there is no temperature fluctuation therein.

The output reference voltage Vout is shown in formula 4 shown below, wherein resistance of the resistors RE21 and RE22 is y, the resistance of the resistor RE23 is x, the voltage between the emitter and base of the NPN transistor group GQ1b is VEBGQ1b, the total emitter surface area of the NPN transistor group GQ1b is M, and the total emitter surface area of the PNP transistor group GQ2b is N.

$$Vout = VEBGQ1b + \frac{y}{x} \cdot \frac{k \cdot T}{q} \cdot \log_e\left(\frac{N}{M}\right) \quad \text{[Formula 4]}$$

What is claimed is:

1. A semiconductor device comprising a plurality of bipolar transistors arrayed in a square matrix formation where the number of said bipolar transistors arrayed in a vertical direction is equal to the number of said bipolar transistors arrayed in a horizontal direction, each of said bipolar transistors comprising:

a collector region of a first conductivity type;

a base region of a second conductivity type formed on said collector region and having a square shape as seen in plan view;

an emitter region of the first conductivity type formed in a center on a surface of said base region and having a square shape as seen in plan view;

at least one emitter electrode connected to said emitter region, at least one base electrode connected to said base region and provided in such as way as to surround said at least one emitter electrode; and a collector electrode connected to said collector region and provided in such a way as to surround said at least one base electrode, said collector regions of all of said bipolar transistors being formed of a single semiconductor layer.

2. The semiconductor device according to claim 1, wherein said plurality of bipolar transistors are defined into two or more groups, said collector electrodes in all of said groups are connected commonly, said base electrodes in each group are connected commonly, and said emitter electrodes in each group are connected commonly.

3. The semiconductor device according to claim 2, wherein said plurality of bipolar transistors arrayed in said square matrix formation are partitioned into two groups by a diagonal line of said square matrix formation, those bipolar transistors which are partitioned in one group are symmetrical to those bipolar transistors which are partitioned in the other group with respect to said diagonal line.

4. The semiconductor device according to claim 1, wherein said plurality of bipolar transistors is provided in a reference voltage source circuit.

5. The semiconductor device according to claim 2, wherein said plurality of bipolar transistors is provided in a reference voltage source circuit.

6. The semiconductor device according to claim 3, wherein said plurality of bipolar transistors is provided in a reference voltage source circuit.

* * * * *

UNITED STATES PATENT AND TRADEMARK OFFICE
CERTIFICATE OF CORRECTION

PATENT NO. : 6,611,043 B2  
DATED : August 26, 2003  
INVENTOR(S) : Tomio Takiguchi It is certified that error appears in the above-identified patent and that said Letters Patent is hereby corrected as shown below:

Column 1,
Line 33, delete "is"

Column 2,
Line 21, Formula 1, delete "VERBG31" insert -- VERBGQ31 --
Line 45, delete "JURNAL" insert -- JOURNAL --

Column 7,
Line 19, delete "will"

Column 9,
Lines 21, 24, 26, 28, 41, 50 and 52, delete "NPN" insert -- PNP --

Column 10,
Line 22, delete "as" insert -- a --

Signed and Sealed this

Tenth Day of February, 2004

JON W. DUDAS
*Acting Director of the United States Patent and Trademark Office*